United States Patent
Zhou et al.

(10) Patent No.: US 9,397,655 B2
(45) Date of Patent: Jul. 19, 2016

(54) DISCHARGE CIRCUIT FOR POWER SUPPLY UNIT

(71) Applicant: ScienBiziP Consulting (Shen Zhen) Co., Ltd., Shenzhen (CN)

(72) Inventors: Hai-Qing Zhou, Shenzhen (CN); Yi-Xin Tu, Shenzhen (CN)

(73) Assignee: ScienBiziP Consulting (Shenzhen) Co., Ltd., Shenzhen (CN)

( * ) Notice: Subject to any disclaimer, the term of this patent is extended or adjusted under 35 U.S.C. 154(b) by 317 days.

(21) Appl. No.: 14/141,403

(22) Filed: Dec. 26, 2013

(65) Prior Publication Data
US 2014/0175903 A1 Jun. 26, 2014

(30) Foreign Application Priority Data
Dec. 26, 2012 (CN) .......................... 2012 1 05730478

(51) Int. Cl.
H03K 17/284 (2006.01)
H01H 3/32 (2006.01)

(52) U.S. Cl.
CPC ............. *H03K 17/284* (2013.01); *Y10T 307/76* (2015.04)

(58) Field of Classification Search
CPC ........................................................ H01H 3/32
USPC ........................................................ 307/115
See application file for complete search history.

(56) References Cited

U.S. PATENT DOCUMENTS

2014/0175902 A1* 6/2014 Zhou .................... H03K 17/284
307/115

\* cited by examiner

*Primary Examiner* — Robert Deberadinis
(74) *Attorney, Agent, or Firm* — ScienBiziP, P.C.

(57) ABSTRACT

A discharge circuit includes a pulse width modulator (PWM) chip, a first and second electronic switch, and a resistor. The first electronic switch receives a voltage creep from the PWM chip. When the voltage creep is less than a voltage making the first electronic switch to turned on, the voltage creep is discharged through the resistor and the second electronic switch.

7 Claims, 1 Drawing Sheet

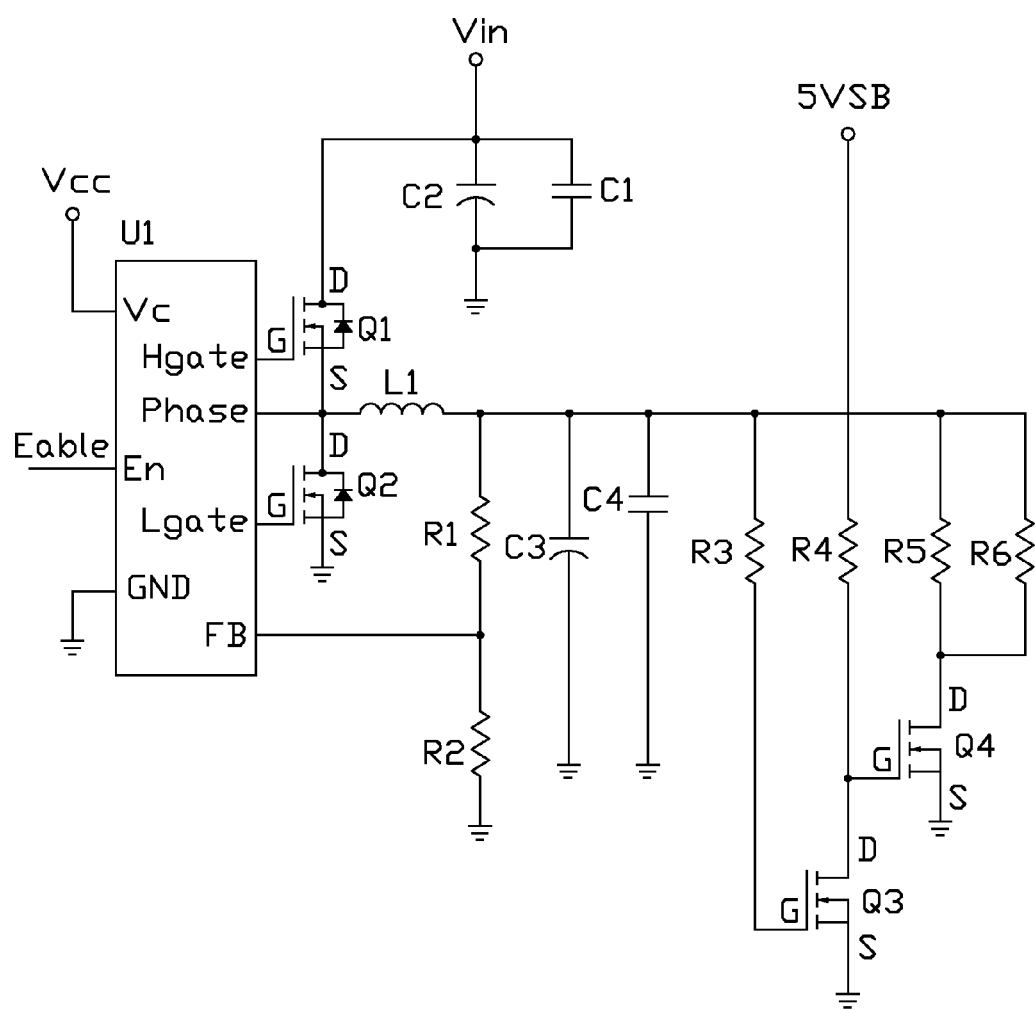

DISCHARGE CIRCUIT FOR POWER SUPPLY UNIT

CROSS-REFERENCE TO RELATED APPLICATIONS

Relevant subject matter is disclosed in one co-pending U.S. patent application Ser. No. 14/141,401 having the same titles, which are assigned to the same assignees as this patent application.

BACKGROUND

1. Technical Field

The present disclosure relates to a discharge circuit.

2. Description of Related Art

During a power-on operation of a computer, a voltage creep may be generated when a system voltage is output later than a stand-by voltage. A resistor may be used to discharge the voltage creep. However, the resistor is still working when the computer is powered on, which wastes energy.

Therefore, there is room for improvement in the art.

BRIEF DESCRIPTION OF THE DRAWING

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

The FIGURE is a circuit diagram of an embodiment of a discharge circuit.

DETAILED DESCRIPTION

The disclosure is illustrated by way of example and not by way of limitation in the FIGURE of the accompanying drawings in which like references indicate similar elements. It should be noted that references to "an" or "one" embodiment in this disclosure are not necessarily to the same embodiment, and such references mean "at least one."

The FIGURE illustrates an embodiment of a discharge circuit. The discharge circuit comprises a pulse width modulator (PWM) chip U1, four capacitors C1-C4, six resistors R1-R6, an inductance L1, and four transistors Q1-Q4.

A phase output pin Phase of the PWM chip U1 is coupled to a first terminal of the inductance L1. A gate G of the transistor Q3 is coupled to a second terminal of the inductance L1 through the resistor R3. A source S of the transistor Q3 is connected to ground. A drain D of the transistor Q3 is coupled to a stand-by power terminal 5VSB through the resistor R4, and is also coupled to a gate G of the transistor Q4. A source S of the transistor Q4 is connected to ground. A drain D of the transistor Q4 is coupled to a first terminal of an inductance L1 through the resistors R5 and R6 connected in parallel.

A voltage pin Vc of the PWM chip U1 is coupled to the system power terminal Vcc. The enable pin En is used to receive an enable signal Enable. A ground pin GND of the PWM chip U1 is connected to ground. A high gate output pin Hgate of the PWM chip U1 is coupled to a gate G of the transistor Q1. A drain D of the transistor Q1 is coupled to a system power terminal VIN. The power system terminal VIN is connected to ground parallel through capacitors C1 and C2. A source S of the transistor Q1 is coupled to the phase output pin Phase. A low gate output pin Lgate is coupled to a gate G of a transistor Q2. A drain D of transistor Q2 is coupled to the phase output pin Phase. A source S of the transistor Q2 is connected to ground. A voltage output pin FB of the PWM chip U1 is connected to ground through a resistor R2, and is coupled to the second terminal of the inductance L1. The second terminal of the inductance L1 is further connected to ground through capacitors C3 and C4 connected in parallel.

In the embodiment, during a power-on operation, if the system power terminal VCC is not output a system voltage, while the stand-by power terminal 5VSB outputs a stand-by voltage, the PWM chip U1 outputs a voltage creep through the phase output pin Phase. When the voltage creep is less than a voltage that makes the transistor Q3 turn on, the gate G of the transistor Q4 is coupled to the stand-by power terminal 5VSB, and the gate G of the transistor Q3 receives the low-voltage level control signal, and the transistor Q3 is turned off, and the gate G of the transistor Q4 is at high-voltage level. Accordingly, the transistor Q4 is turned on, and the voltage creep is discharged through the resistors R6, R7 and the transistor Q4.

When the voltage creep is equal to or greater than the voltage that makes the transistor Q3 turn on, the transistor Q3 is turned on. Accordingly, the gate G of the transistor Q3 is at high-voltage level, and the transistor Q3 is turned on, and the gate G of the transistor Q3 is at low-voltage level, such as logic 0, the transistor Q4 is turned off. According, the resistors R6 and R7 are no longer consume power.

In the embodiment, the transistors Q1-Q4 are n-channel metal oxide field effective transistors (NMOSFET).

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A discharge circuit, comprising:
    a pulse width modulator chip comprising a phase output pin coupled to a first terminal of an inductance; and
    first and second electronic switches each comprising first to third terminals, wherein the first terminal of the first electronic switch is coupled to a second terminal of the inductance through a first resistor, the second terminal of the first electronic switch is connected to ground, the third terminal of the first electronic switch is coupled to a stand-by power terminal through a second resistor; the third terminal of the first electronic switch is coupled to the first terminal of the second electronic switch; the second terminal of the second electronic switch is connected to ground, the third terminal of the third electronic switch is coupled to the second terminal of the inductance through a third resistor;
    wherein when the first terminals of the first and second electronic switches are at low-voltage level, the first and second electronic switches are turned on; when the first terminals of the first and second electronic switches, the first and second electronic switch are turned off.

2. The discharge circuit of claim 1, further comprising a fourth resistor, wherein the third terminal of the second electronic switch is coupled to the second terminal of the inductance through the fourth resistor.

3. The discharge circuit of claim 2, wherein the PWM chip further comprises a high gate output pin, a low gate output pin, and a voltage output pin, the high gate output pin is coupled to a first terminal of a third electronic switch, a second terminal of the third electronic switch is coupled to the phase output pin of the PWM chip, a third terminal of the third electronic switch is coupled to a system power terminal, the system power terminal is connected to ground through a first capacitor; the low gate output pin of the PWM chip is coupled to a first terminal of a fourth electronic switch, a second terminal of the fourth electronic switch is connected to ground, the third terminal of the fourth electronic switch is coupled the phase output pin; the voltage output pin is coupled to the second terminal of the inductance through a fifth resistor, and is connected to ground through a sixth resistor.

4. The discharge circuit of claim 3, wherein the second terminal of the inductance is connected to ground through a second capacitor.

5. The discharge circuit of claim 4, wherein the second terminal of the inductance is connected to ground through a third capacitor.

6. The discharge circuit of claim 5, wherein the system power terminal is connected to ground trough a fourth capacitor.

7. The discharge circuit of claim 6, wherein the first to fourth electronic switches are n-channel metal oxide field effective transistors (NMOSFET), the first terminals, the second terminals, and the third terminals of the first to fourth electronic switches are gates, sources, and drains of the NMOSFET, respectively.

\* \* \* \* \*